United States Patent
Sugimura et al.

(10) Patent No.: US 10,247,785 B2
(45) Date of Patent: Apr. 2, 2019

(54) ASSEMBLED-BATTERY SYSTEM, SEMICONDUCTOR CIRCUIT, AND DIAGNOSTIC METHOD

(71) Applicants: LAPIS Semiconductor Co., Ltd., Kanagawa (JP); YAZAKI CORPORATION, Tokyo (JP)

(72) Inventors: Naoaki Sugimura, Kanagawa (JP); Takaaki Izawa, Shizuoka (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 142 days.

(21) Appl. No.: 14/897,154

(22) PCT Filed: Jun. 11, 2014

(86) PCT No.: PCT/JP2014/065504
§ 371 (c)(1),
(2) Date: Dec. 9, 2015

(87) PCT Pub. No.: WO2014/200032
PCT Pub. Date: Dec. 18, 2014

(65) Prior Publication Data
US 2016/0131717 A1    May 12, 2016

(30) Foreign Application Priority Data

Jun. 12, 2013    (JP) ................. 2013-124054

(51) Int. Cl.
*G01R 31/36* (2006.01)
*G01R 35/00* (2006.01)
*H01M 10/48* (2006.01)

(52) U.S. Cl.
CPC ....... *G01R 31/3658* (2013.01); *G01R 31/362* (2013.01); *G01R 35/00* (2013.01); *H01M 10/482* (2013.01); *G01R 31/3679* (2013.01)

(58) Field of Classification Search
None
See application file for complete search history.

(56) References Cited

U.S. PATENT DOCUMENTS

2010/0244847 A1*  9/2010  Kudo .................... B60L 3/0046
                                                              324/433
2010/0321026 A1* 12/2010  Matsuura ........... G01R 31/3658
                                                              324/434

FOREIGN PATENT DOCUMENTS

JP   H08-189845 A    7/1996
JP   2010-016298 A   1/2010

OTHER PUBLICATIONS

Written Opinion dated Aug. 19, 2014 for International Application No. PCT/JP2014/065504.

* cited by examiner

*Primary Examiner* — Jonathan G Leong
*Assistant Examiner* — Christopher P Domone
(74) *Attorney, Agent, or Firm* — Volentine, Whitt & Francos, PLLC

(57) ABSTRACT

An assembled-battery system, a semiconductor circuit, and a diagnostic method enables appropriate self-diagnosis of a measuring unit. An output value (A-B) output from an analog-to-digital converter through power-supply lines, a cell-selection switch, and a level shifter is summed with an output value (B-VSS) obtained by a directly input reference voltage B being output from the analog-to-digital converter. When the summed value is considered equal the reference voltage A—the voltage VSS, it is diagnosed that an abnormality such as a breakdown has not occurred.

6 Claims, 9 Drawing Sheets

ASSEMBLED-BATTERY SYSTEM, SEMICONDUCTOR CIRCUIT, AND DIAGNOSTIC METHOD

TECHNICAL FIELD

The present invention relates to an assembled-battery system, a semiconductor circuit, and a diagnostic method. In particular, the present invention relates to an assembled-battery system, a semiconductor circuit, and a diagnostic method that measure the voltage of plural batteries connected in series.

BACKGROUND ART

Generally, battery-units, in which plural batteries (battery cells) are connected in series, are employed as high output, high capacity battery-units employed for, for example, driving the motors of hybrid automobiles and electric automobiles. Specific examples of such battery-units include lithium ion battery-units. An assembled-battery system is known that measures battery voltages in order to monitor and control the battery voltages of batteries in a battery-unity.

A conventional assembled-battery system of this sort is known in which the battery voltage of each battery cell is measured using the difference between voltage at the high potential side and the voltage at the low potential side of plural battery cells connected together in series. For example, in the technology described by Japanese Patent Application Laid-Open (JPA) No. 2010-16928, (two) terminals out of terminals connected to respective battery cells through power-supply lines are selected by a multiplexer, and output to a differential amplifier. Moreover, in the technology described by JP-A No. 2010-16928, an analog electrical signal output from the differential amplifier is output as a digital electrical signal, and the battery voltage across each battery cell is measured based on the digital electrical signal.

JP-A No. H08-189845 describes a digital measuring device that includes self-diagnostic functionality. As illustrated in FIG. 9, the digital measuring device described in JP-A No. H08-189845 includes a range switching circuit 109 that switches the gain of a single input circuit, and has functionality for performing self-diagnostics of the single input circuit (the range switching circuit 109). In the range switching circuit 109 illustrated in FIG. 9, gain is switched according to whether switching element switches 192, 193 are connected to an NC side or an NO side.

For example, the gain of the range switching circuit 109 is set at gain G1 or gain G2. In the signal input circuit illustrated in FIG. 9, G1×A, which is a value obtained when a reference voltage A is input to the range switching circuit 109 with gain G1, and G2×A, which is a value obtained when the reference voltage A is input to the range switching circuit 109 with gain G2, are AD (analog-to-digital) converted, and a ratio of the gain G1 and the gain G2 is found from the AD converted signal in order to diagnose whether or not gain switching is functioning normally.

SUMMARY OF INVENTION

Technical Problem

However, in the technology described by JP-A No. H08-189845 above, the precision in the reference voltage A must be raised to the input/output conversion precision of the circuit subject to self-diagnosis or greater in order to diagnose the precision of the gain G1 and the gain G2 of the range switching circuit 109 itself.

When a differential input circuit is employed as the circuit targeted by the self-diagnosis technology described by JP-A No. H08-189845, a reference voltage B (a voltage source that supplies a reference voltage B) is also needed in order to perform self-diagnosis, since there are two input systems. Similarly to the reference voltage A described above, an issue occurs in that the reference voltage B requires precision equal to the input/output conversion precision of the circuit subject to self-diagnosis or greater.

Accordingly, a differential amplifier is employed in an assembled-battery system such as the technology described by JP-A No. 2010-16928 above, and the above issues occur when the self-diagnosis technology described by JP-A No. H08-189845 is applied to the self-diagnosis technology for the differential amplifier. As a result, there is a concern that self-diagnosis cannot be performed appropriately.

The present invention provides a semiconductor circuit, an assembled-battery system, and a diagnosis method that enable appropriate self-diagnosis of a measuring means.

Solution to Problem

A first aspect of the present invention is an assembled-battery system including: plural batteries connected together in series; plural power-supply lines respectively connected to the plural batteries; a selection unit that selects two power-supply lines from the plural power-supply lines; a measuring unit that includes a conversion unit that converts an analog signal into a digital signal, and that, in cases in which electrical signals flowing through the two power-supply lines selected by the selection unit have been input, converts the difference between the electrical signals flowing through the two power-supply lines in order to monitor the battery voltages of the plural batteries into a digital signal and outputs the digital signal; an arithmetic unit that performs predetermined arithmetic on the digital signal output from the measuring unit, and outputs an electrical signal corresponding to the arithmetic result; and a reference voltage divider that supplies a second reference voltage, obtained by voltage dividing a first reference voltage, to the power-supply lines. Self-diagnosis of the measuring unit is performed based on whether or not a summed value, summed by the arithmetic unit, of the difference between the first reference voltage and the second reference voltage that have been output from the measuring unit, and the difference between the second reference voltage and a third reference voltage that is smaller than the second reference voltage, is a value corresponding to the first reference voltage.

A second aspect of the present invention is a semiconductor circuit including: plural power-supply lines respectively connected to plural serially connected batteries; a selection unit that selects two power-supply lines from the plural power-supply lines; a measuring unit that includes a conversion unit that converts an analog signal into a digital signal, and that, in cases in which electrical signals flowing through the two power-supply lines selected by the selection unit have been input, converts the difference between the electrical signals flowing through the two power-supply lines in order to monitor the battery voltages of the plural batteries into a digital signal and outputs the digital signal; and a reference voltage divider that supplies a second reference voltage, obtained by voltage dividing a first reference voltage, to the power-supply lines. Self-diagnosis of the measuring unit is performed based on whether or not a summed value of the difference between the first reference voltage and the second reference voltage that have been output from the measuring unit, and the difference between the second reference voltage and a third reference voltage that is smaller than the second reference voltage, is a value corresponding to the first reference voltage.

A third aspect of the present invention is a diagnostic method of a measuring unit of a semiconductor circuit, wherein the semiconductor circuit includes: plural power-supply lines respectively connected to plural serially connected batteries; a selection unit that selects two power-supply lines from the plural power-supply lines; a measuring unit that includes a conversion unit that converts an analog signal into a digital signal, and that, in cases in which electrical signals flowing through the two power-supply lines selected by the selection unit have been input, converts the difference between the electrical signals flowing through the two power-supply lines into a digital signal and outputs the digital signal; and a reference voltage divider that supplies a second reference voltage, obtained by voltage dividing a first reference voltage, to the power-supply lines. The diagnostic method includes: a step in which the difference between the first reference voltage and the second reference voltage is output by the measuring unit; a step in which the difference between the second reference voltage and a third reference voltage that is smaller than the second reference voltage is output by the measuring unit; and a step in which determination is made as to whether or not the summed value of the difference between the first reference voltage and the second reference voltage that are output from the measuring unit, and the difference between the second reference voltage and the third reference voltage, is a value corresponding to the first reference voltage.

Advantageous Effects

The above aspects of the present invention exhibit the advantageous effect of enabling self-diagnosis of a measuring unit to be performed properly.

BRIEF DESCRIPTION OF DRAWINGS

FIG. 6 is a circuit diagram illustrating a specific example of a state of a voltage measuring circuit when performing self-diagnosis by selecting a power-supply line Vn and a power-supply line Vn−1.

DESCRIPTION OF EMBODIMENTS

Explanation follows regarding an overall outline of an assembled-battery system of an exemplary embodiment, with reference to the drawings.

Figure 1:
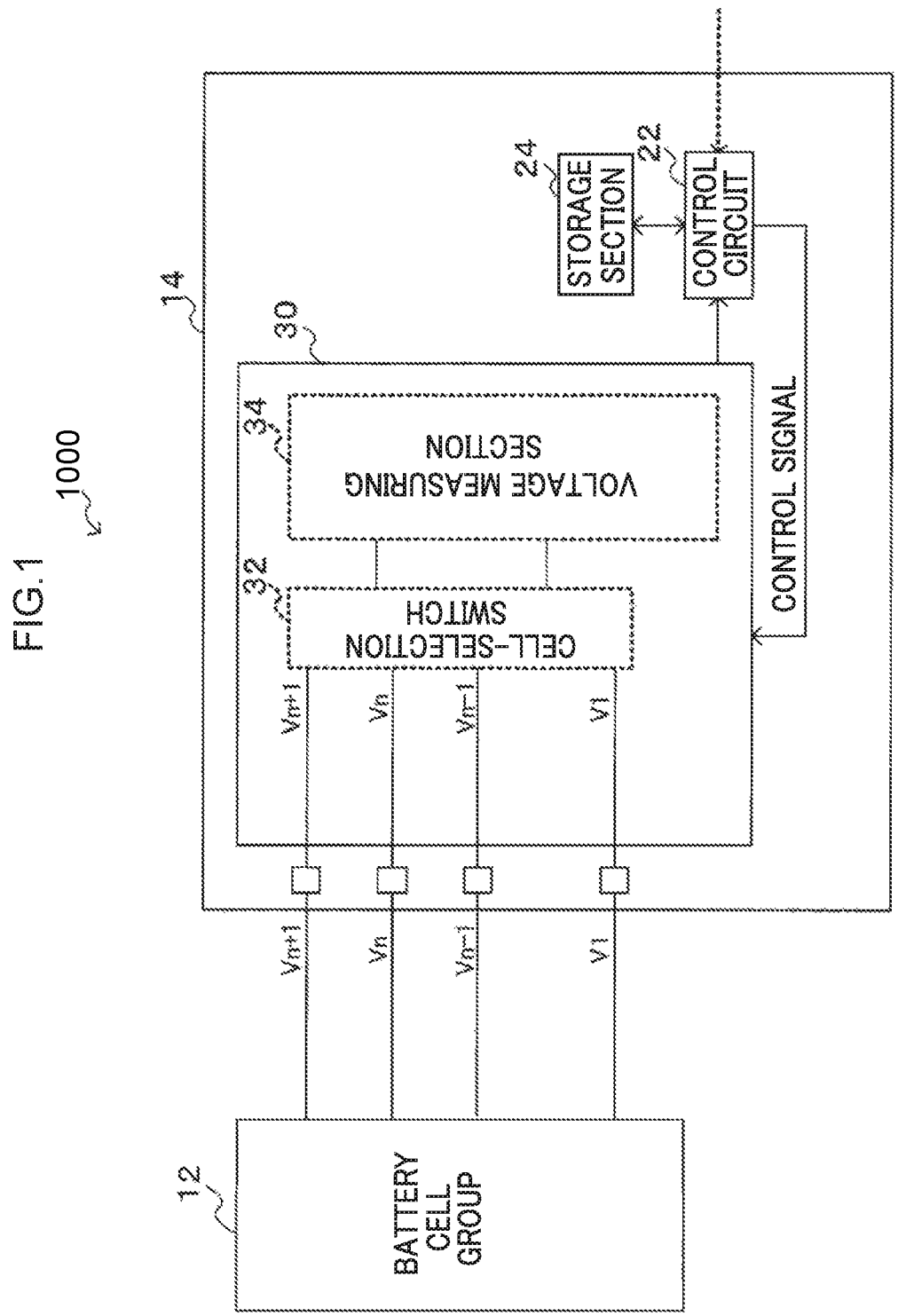
FIG. 1 is a circuit diagram illustrating an example of a schematic configuration of an assembled-battery system of an exemplary embodiment.

First, explanation follows regarding a configuration of the assembled-battery system of the present exemplary embodiment. An example of a schematic configuration of the assembled-battery system 1000 of the present exemplary embodiment is illustrated in FIG. 1. The assembled-battery system 1000 of the present exemplary embodiment illustrated in FIG. 1 includes a battery cell group 12 that includes plural battery cells, and a semiconductor circuit 14 that measures the voltage of the respective battery cells of the battery cell group 12.

Figure 2:
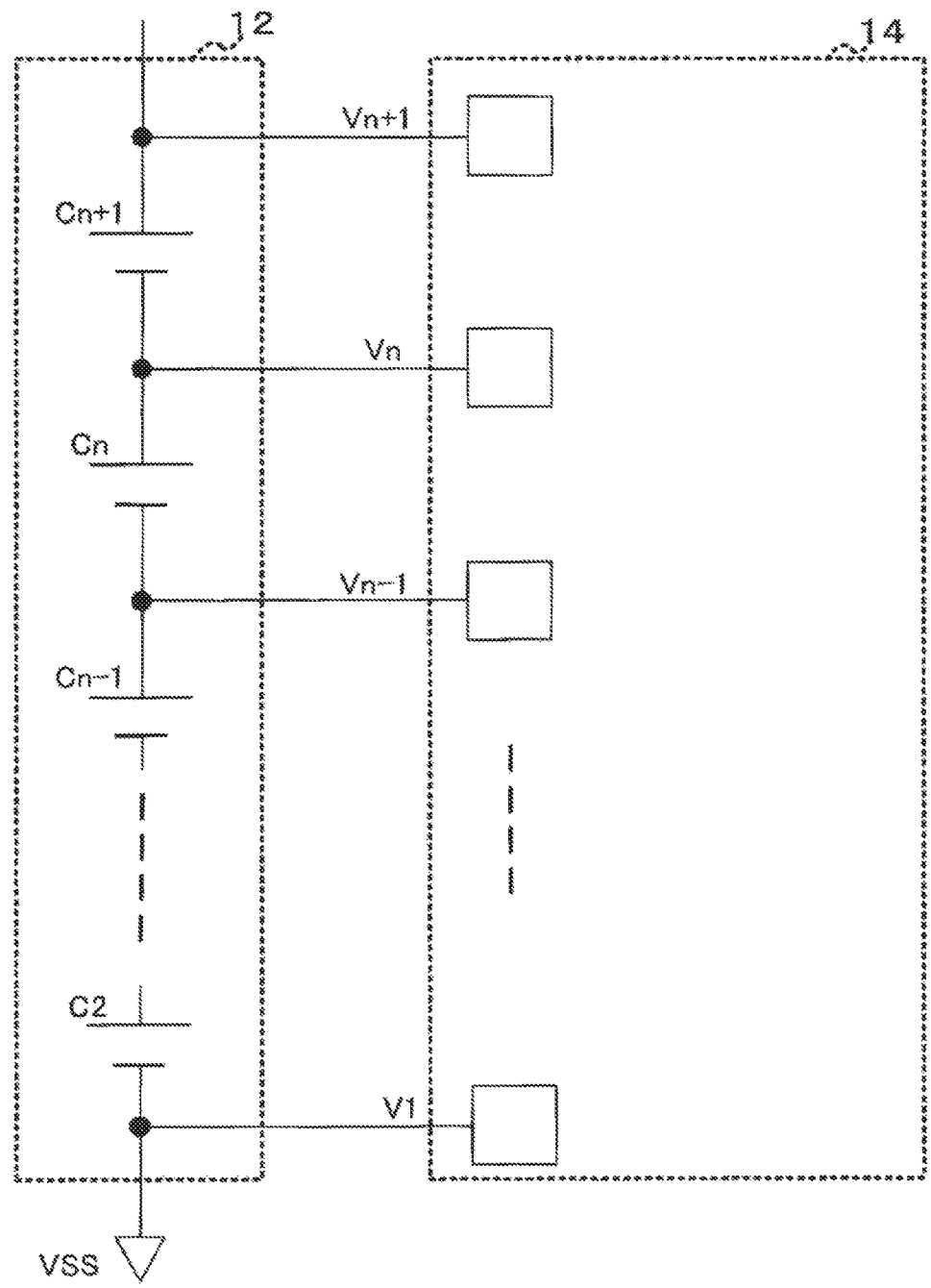
FIG. 2 is a circuit diagram illustrating an example of a configuration of a battery cell group of the exemplary embodiment.

As illustrated in FIG. 2, the battery cell group 12 includes plural battery cells C connected in series. Note that FIG. 1 and FIG. 2 illustrate a case in which n units of the battery cells C (from $C_2$ to $C_{n+1}$) are connected in series as a specific example. In the present exemplary embodiment, the highest potential side of the battery cell group 12 is the battery cell $C_{n+1}$, and the lowest potential side is battery cell $C_2$. Power-supply lines V ($V_1$ to $V_{n+1}$) of the semiconductor circuit 14 are connected to the high potential side and low potential side of each of the battery cells C (between pairs of the battery cells C), through terminals (pads).

The semiconductor circuit 14 includes a control circuit 22, a storage section 24, and a voltage measuring circuit 30 that includes self-diagnosis functionality (simply referred to as the voltage measurement circuit 30 hereafter).

The voltage measurement circuit 30 includes functionality for measuring the battery voltage of each of the battery cells C based on the difference between the voltage of the high potential side and the voltage of the low potential side of each of the battery cells C. The voltage measurement circuit 30 of the present exemplary embodiment includes a cell-selection switch 32 and a voltage measuring section 34. In the voltage measurement circuit 30, the power-supply line V connected to the high potential side of the battery cell C and the power-supply line V connected to the low potential side of the battery cell C are selected for each respective battery cell C by the cell-selection switch 32, and respective corresponding electrical signals (analog signals) are output to the voltage measuring section 34. The voltage measuring section 34 includes functionality for converting, into a digital signal, the difference between the electrical signal corresponding to the power-supply line V connected to the high potential side and the electrical signal corresponding to the power-supply line V connected to the low potential side of the battery cell C output from the cell-selection switch 32, and outputting the converted electrical signal (digital signal) to the control circuit 22.

Moreover, voltage measurement circuit 30 of the present exemplary embodiment includes functionality for self-diagnosis of whether or not battery voltages are properly measured by the voltage measuring section 34 (explained in detail below).

The control circuit 22 is a logical circuit that includes functionality for outputting a control signal to cause the voltage measurement circuit 30 to measure the battery voltage of the respective battery cells C, and a control signal to cause self-diagnosis to be performed by the voltage measurement circuit 30. The control circuit 22 executes a program and outputs the control signal to the voltage measurement circuit 30, when a battery voltage measurement instruction or a self-diagnosis instruction is received.

The storage section 24 includes functionality for storing output values (A-B), output values (B-VSS), and the like, described in detail below. A register, a hard disk, memory, or the like may be employed as a specific example of the storage section 24.

Figure 3:
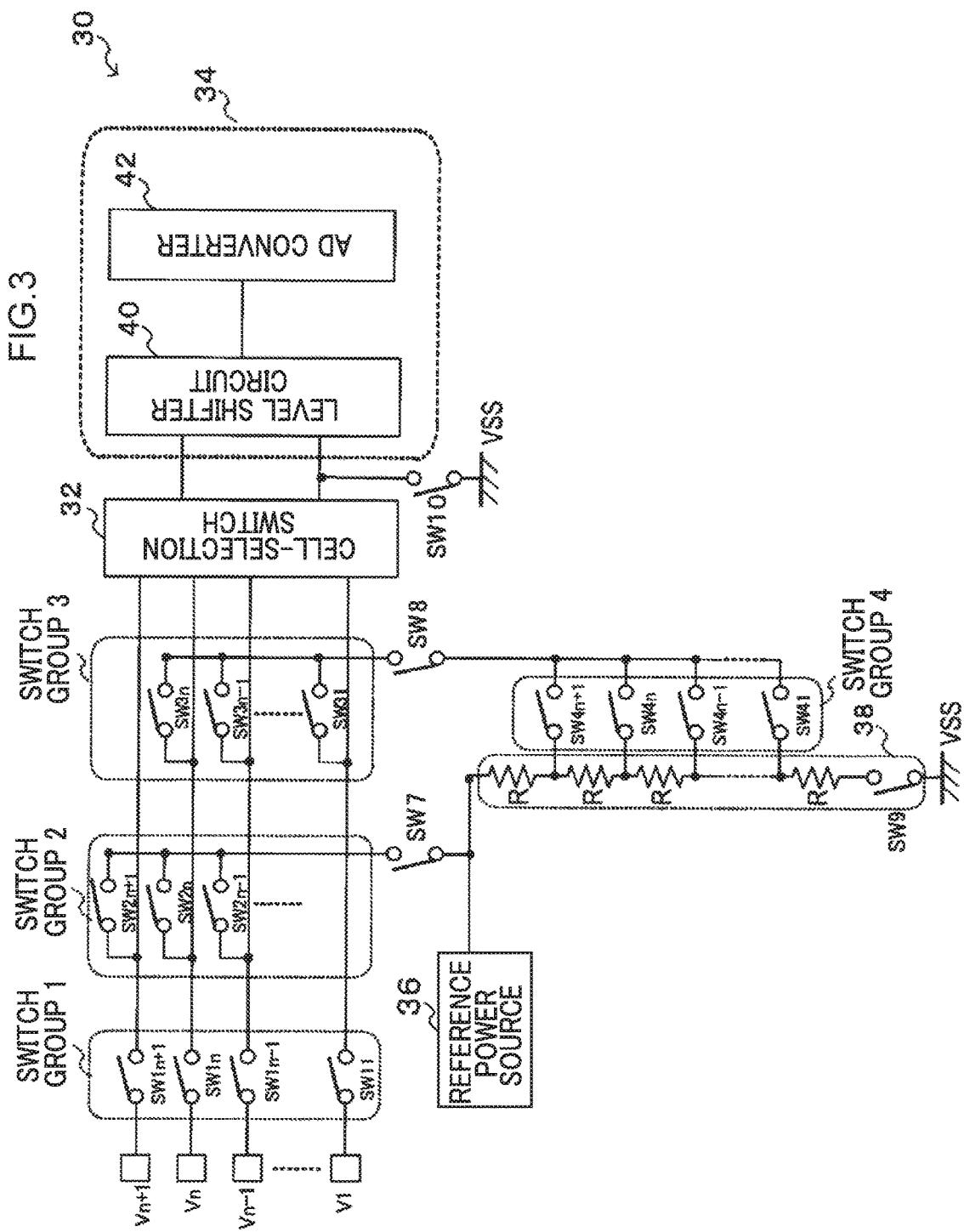
FIG. 3 is a circuit diagram illustrating an example of a voltage measuring circuit including self-diagnosis functionality in a semiconductor circuit of the exemplary embodiment.

Next, detailed explanation follows regarding the voltage measurement circuit 30. FIG. 3 illustrates an example of a configuration of the voltage measurement circuit 30 of the present exemplary embodiment. As illustrated in FIG. 3, the voltage measurement circuit 30 of the present exemplary embodiment includes the cell-selection switch 32, the voltage measuring section 34, a reference power source 36, a reference voltage dividing resistor 38, a switch group 1, a switch group 2, a switch group 3, a switch group 4, a switching element switch 7, a switching element switch 8, and a switching element switch 10.

The switch group 1 includes respective switching element switches 1 (switch $1_1$ to switch $1_{n+1}$) for each of the power-supply lines V. The switch group 1 includes functionality for switching the connected state of the battery cell group 12 (the battery cells C) with respect to the cell-selection switch 32. Input of voltage (battery voltage) to the cell-selection switch 32 from the battery cell group 12 (battery cells C) can be cut off by setting the switch group 1 to the OFF state.

The switch group 2 includes respective switching element switches 2 (switch $2_2$ to switch $2_{n+1}$) for each of the power-supply lines V connected to the high potential side of the battery cells C. The switch group 2 includes functionality for connecting the cell-selection switch 32 and the high potential sides of the battery cells C together when performing self-diagnosis.

The switch group 3 includes respective switching element switches 3 (switch $3_1$ to switch $3_n$) for each of the power-supply lines V connected to the low potential side of the battery cells C. The switch group 3 includes functionality for connecting the cell-selection switch 32 to the low potential sides of the battery cells C when performing self-diagnosis.

As described above, the cell-selection switch 32 includes functionality that, when measuring the battery voltages of the battery cells C of the battery cell group 12, selects the power-supply line V connected to the high potential side and the power-supply line V connected to the low potential side of the battery cell C, and outputs respective corresponding electrical signals (analog signals) to a level shifter circuit 40 (the voltage measuring section 34).

The cell-selection switch 32 is not particularly limited as long as functionality is included for selecting an electrical signal flowing in a specific power-supply line from out of the power-supply lines V, and outputting the selected electrical signal to the level shifter circuit 40. Note that, as an example, the cell-selection switch 32 of the present exemplary embodiment includes a MUX (multiplexer) or the like that includes switching element switches for each of the power-supply lines V.

Moreover, the cell-selection switch 32 of the present exemplary embodiment includes functionality for selecting specific power-supply lines V and outputting corresponding respective electrical signals (analog signals) to the level shifter circuit 40 (voltage measuring section 34) when performing self-diagnosis. Note that the cell-selection switch 32 of the present exemplary embodiment selects the power-supply line V connected to the high potential side and the power-supply line V connected to the low potential side of the battery cells C.

The reference power source 36 includes functionality for generating a reference voltage A as a first reference voltage, and supplying the reference voltage A. The reference voltage dividing resistor 38 includes a voltage dividing resistor element in which plural resistor elements R are connected together in series, and a switching element switch 9 that connects the voltage dividing resistor element to a voltage VSS (0V) serving as a third reference voltage. The switch group 4 includes switching element switches 4 (switch $4_1$ to switch $4_{n+1}$). The switch group 4 includes functionality for, when self-diagnosis is performed, supplying a voltage dividing resistance value (the reference voltage B, serving as a second reference voltage) that is predetermined according to the power-supply line V to perform self-diagnosis on. Note that hereafter, the reference voltage supplied from the reference power source 36 is referred to as the reference voltage A, and the voltage dividing resistance value obtained by dividing the reference voltage A using the reference voltage dividing resistor 38 is referred to as the reference voltage B. Moreover, the voltage VSS may be 0V, or may be the same potential as the low potential side of the battery cell C having the lowest potential in the battery cell group 12 connected to the semiconductor circuit 14.

The reference voltage A is supplied to the power-supply line V when the switching element switch 7 and a specific switching element switch 2 of the switch group 2 assume the ON state. Moreover, the reference voltage B is supplied to the power-supply line V when the switching element switch 9, a specific switching element switch 4 of the switch group 4, the switching element switch 8, and a specific switching element switch 3 of the switch group 3 assume the ON state. Moreover, the switching element switch 10 is connected to the power-supply line at the lower potential side out of the two power-supply lines connecting the cell-selection switch 32 to the level shifter circuit 40. The voltage VSS is supplied to the lower potential side of the power-supply lines when the switching element switch 10 assumes the ON state.

The voltage measuring section 34 of the present exemplary embodiment includes the level shifter circuit 40 and an AD converter 42.

The level shifter circuit 40 includes functionality for outputting an analog electrical signal corresponding to the difference between two electrical signals input from the cell-selection switch 32. In the voltage measuring section 34 of the present exemplary embodiment, the level shifter circuit 40 is not limited to being employed in this manner. The voltage measuring section 34 is not particularly limited as long as functionality is included for outputting an analog electrical signal corresponding to the difference between two electrical signals input from the cell-selection switch 32.

The AD converter 42 is an analog-to-digital convertor that includes functionality for converting an input analog electrical signal into a digital signal and outputting the digital Note that in the voltage measurement circuit 30 of the present exemplary embodiment, a control signal input from the control circuit 22 controls whether the respective switching element switches (switches 1 to switches 4) of the switch group 1 to the switch group 4, the switching element switches included in the cell-selection switch 32, and the switching element switch 7 to the switching element switch 10 are switched ON or OFF.

Figure 4:
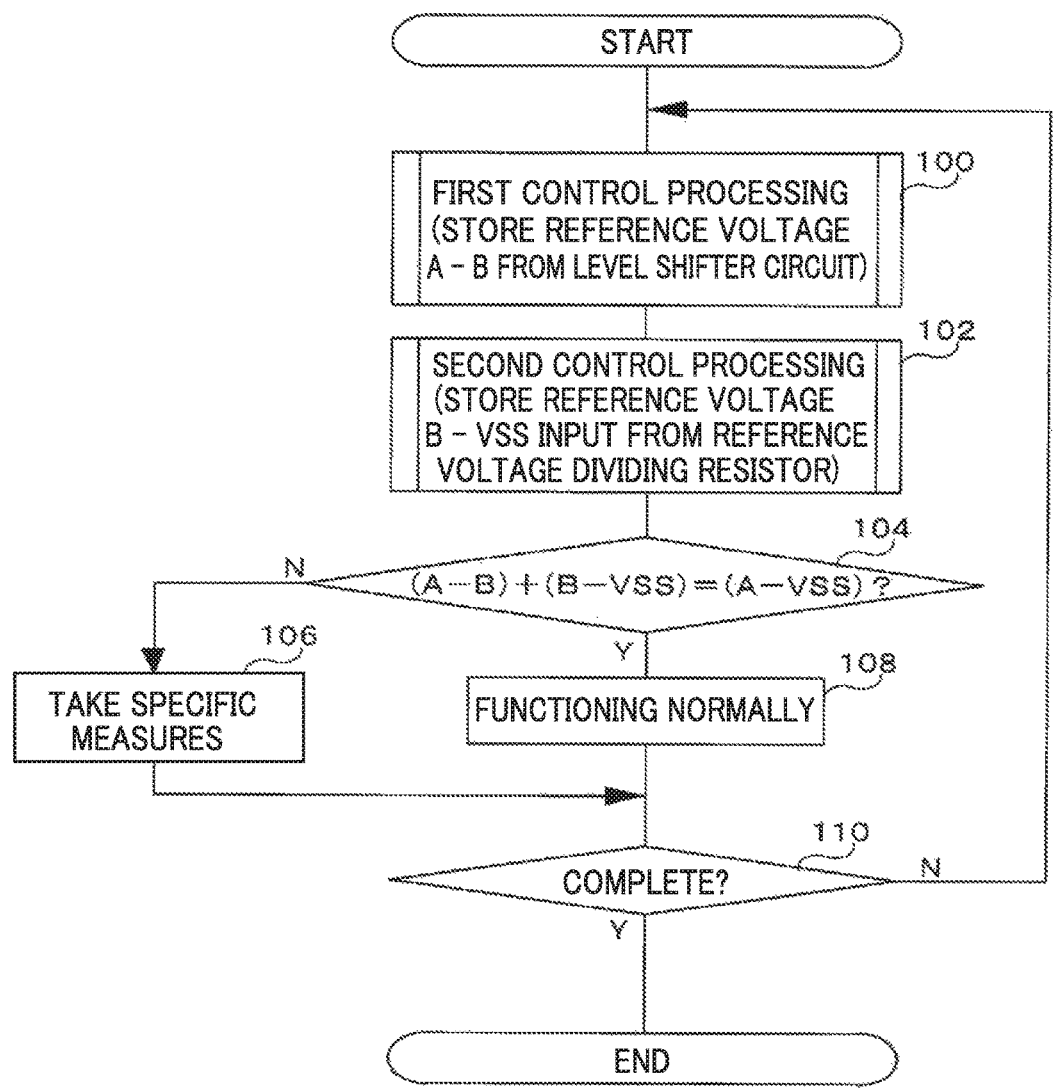
FIG. 4 is a flowchart of an example of a flow of an overall self-diagnosis operation of a voltage measuring circuit in a semiconductor circuit of the exemplary embodiment.
Figure 6:
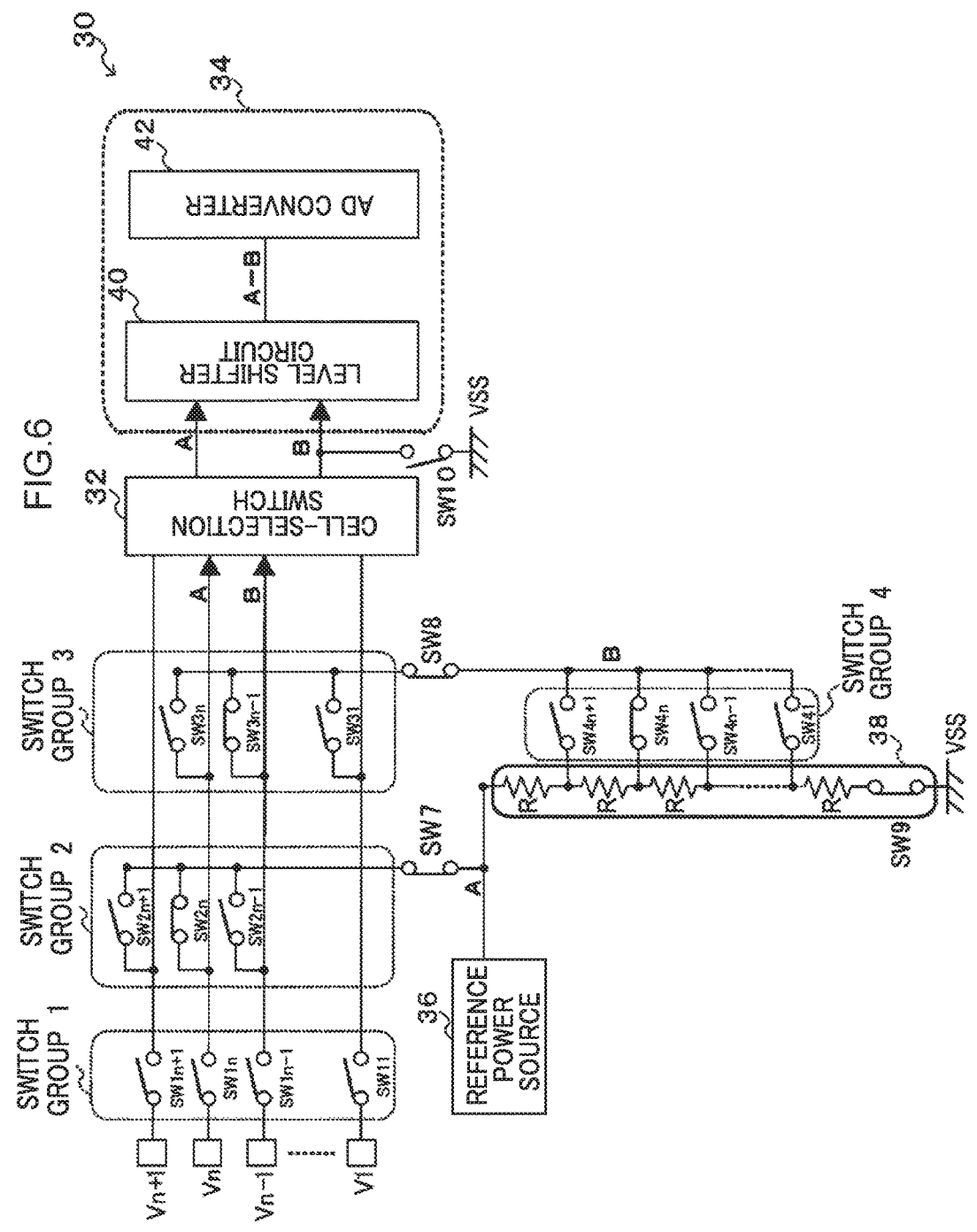
Figure 8:
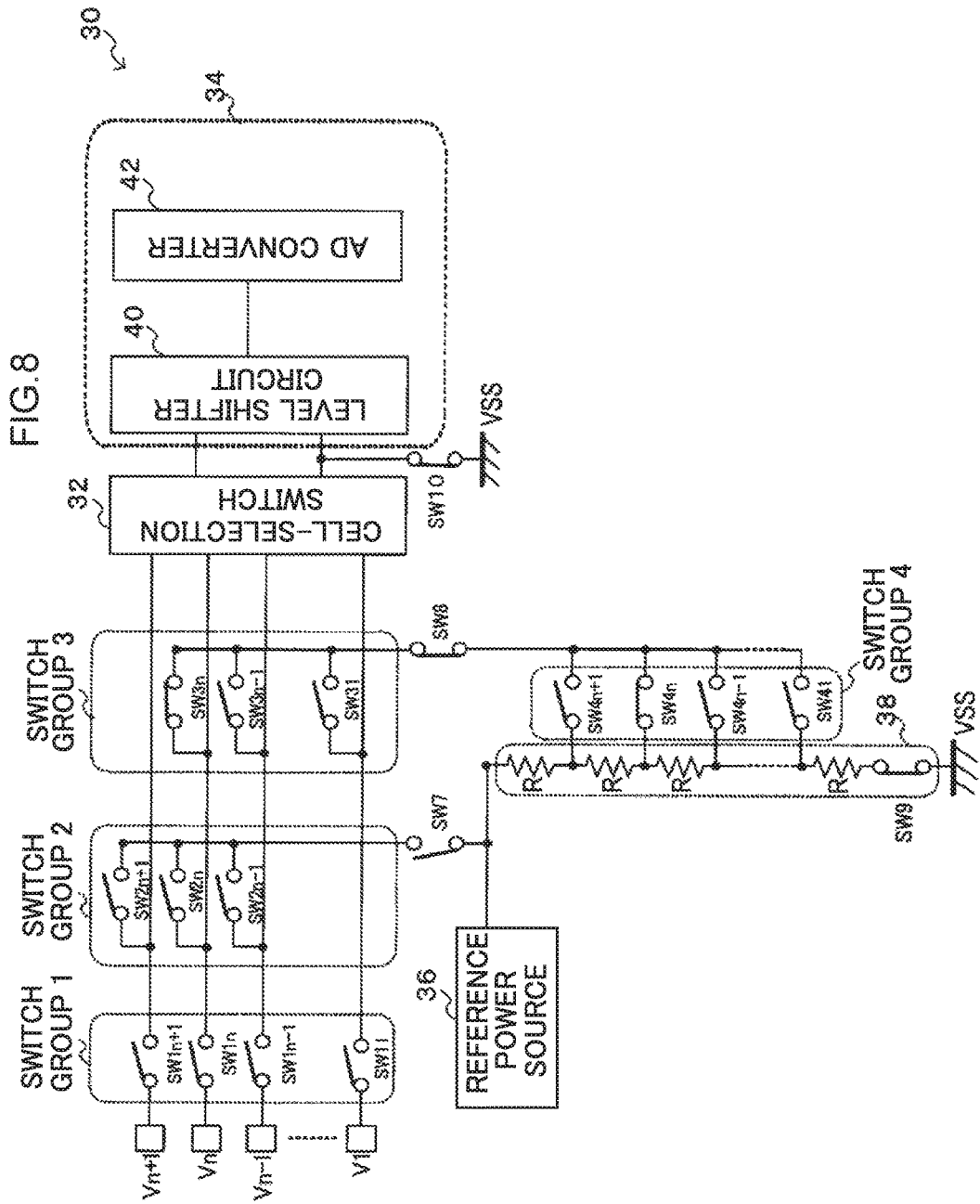
FIG. 8 is a circuit diagram illustrating a specific example of a state of a voltage measuring circuit when performing self-diagnosis by selecting a power-supply line Vn and a power-supply line Vn−1.
Figure 9:
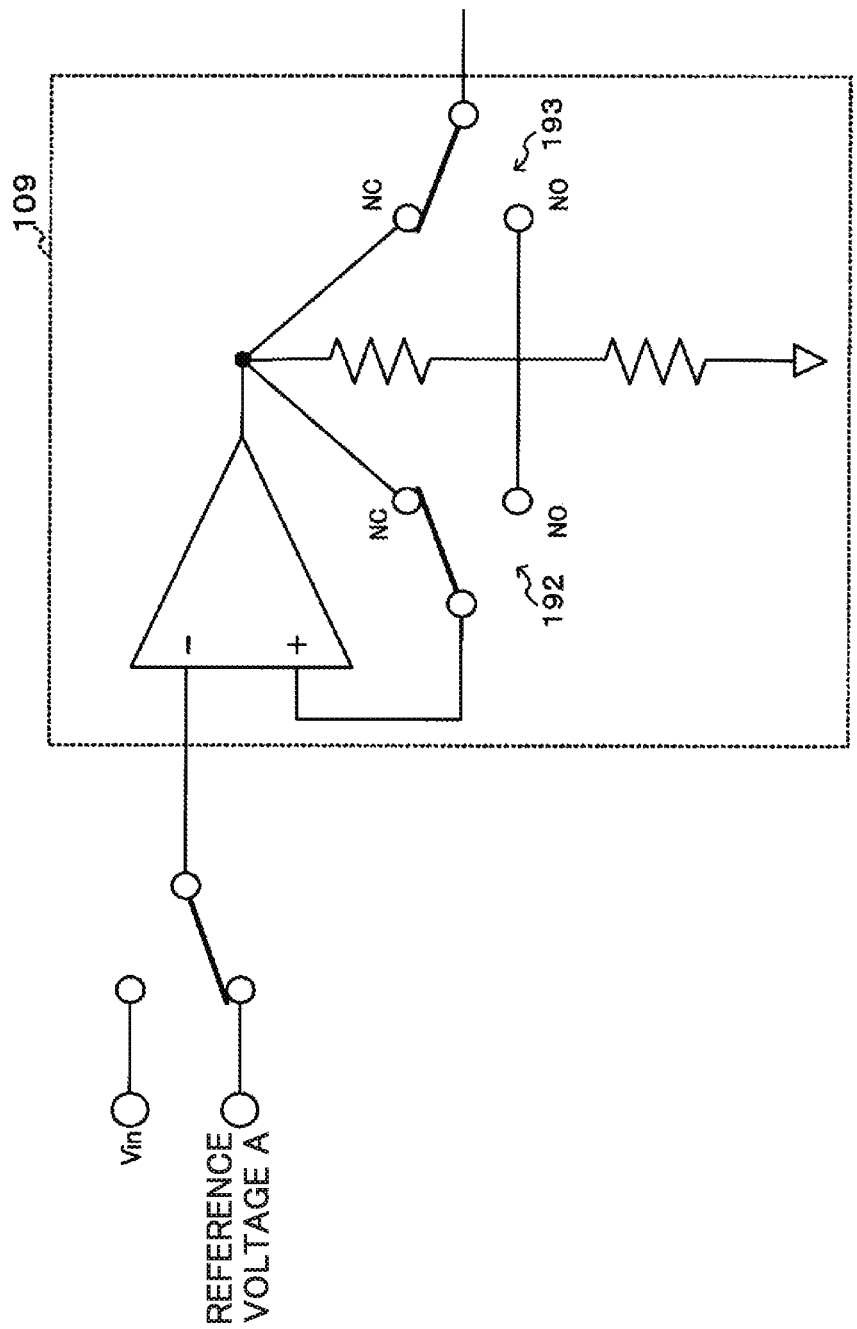
FIG. 9 is a circuit diagram illustrating an example of a schematic configuration of a digital measuring device including conventional self-diagnosis functionality.

Next, explanation follows regarding self-diagnosis functionality of the voltage measurement circuit 30 in the semiconductor circuit 14 of the present exemplary embodiment. A flowchart of an example of flow of an overall self-diagnosis operation of the present exemplary embodiment is illustrated in FIG. 4. The operation is, for example, controlled by execution of a diagnostic program in the control circuit 22. Note that explanation follows regarding a case in which the control circuit 22 performs self-diagnosis by selecting the power-supply line $V_n$ and the power-supply line $V_{n-1}$, as a specific example. A circuit diagram illustrating the state of the voltage measurement circuit 30 in the case of this specific example is illustrated in FIG. 6 and FIG. 8.

Note that in the voltage measurement circuit 30 of the present exemplary embodiment, in the initial state when performing self-diagnosis, each of the switching element switches (switches 1 to switches 4) of the switch group 1 to the switch group 4, the switching element switches included in the cell-selection switch 32, and the switching element switch 7 to the switching element switch 10 are in the OFF state.

First, at step 100, first control processing is performed. First control processing is processing that controls such that an electrical signal corresponding to the reference voltage A and an electrical signal corresponding to the reference voltage B input from the cell-selection switch 32 are output to the level shifter circuit 40, and the electrical signal output from the level shifter circuit 40 through the AD converter 42 (an electrical signal corresponding to the reference voltage A—the reference voltage B) is stored in the storage section 24.

Figure 5:
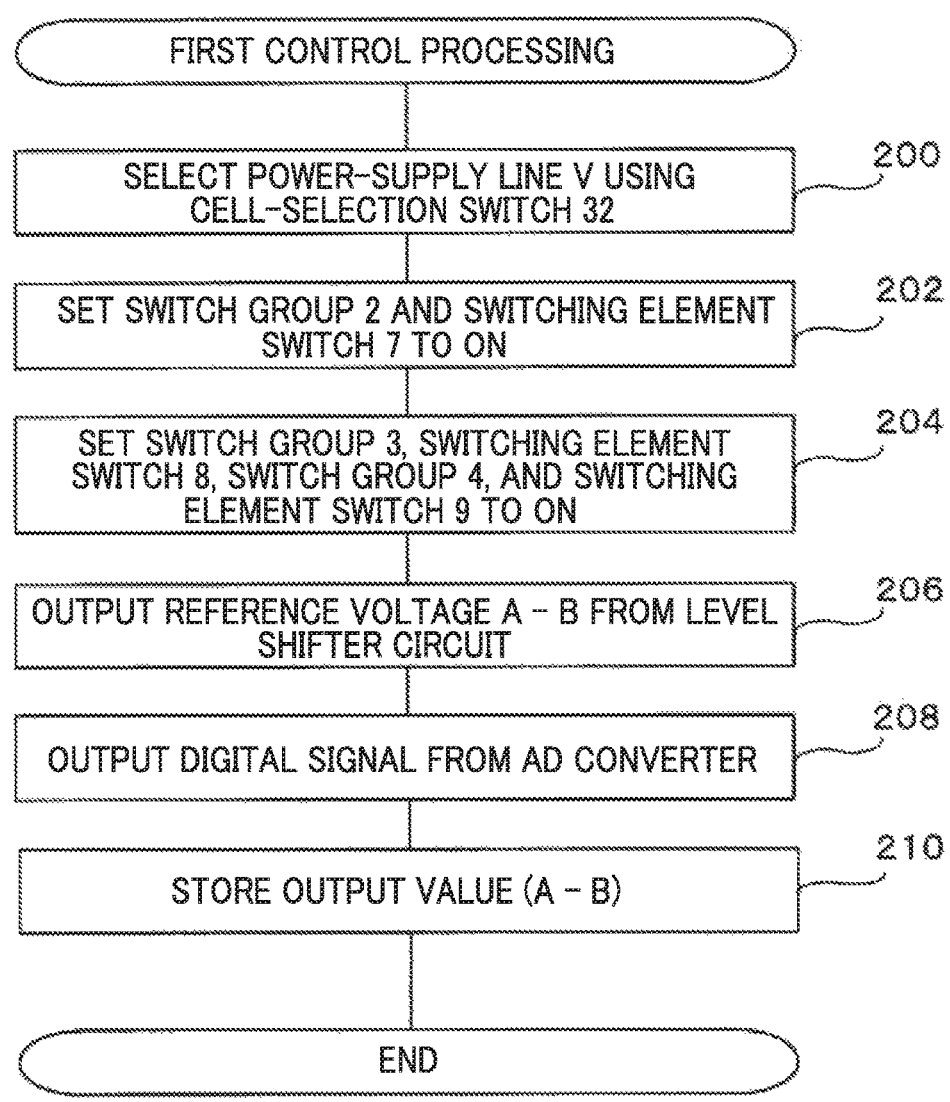
FIG. 5 is a flowchart of an example of a flow of first control processing in a self-diagnosis operation of the exemplary embodiment.

A flowchart of an example of the first control processing is illustrated in FIG. 5.

At step 200, the power-supply line V corresponding to the power-supply line V battery cell C) to be self-diagnosed is selected by the cell-selection switch 32. In the control circuit 22 of the present exemplary embodiment, the power-supply line $V_n$ and the power-supply line $V_{n-1}$ are selected as a specific example.

At the next step 202, the control circuit 22 sets the switching element switch 7 of the switch group 2 that connects the selected power-supply line V (the power-supply line V at the high potential side out of the selected power-supply lines V) to the reference power source 36, to the ON state. As illustrated in FIG. 6, here, the control circuit 22 sets the switching element switch $2_n$ to the ON state. The control circuit 22 also sets the switching element switch 7 to the ON state. An electrical signal corresponding to the reference voltage A supplied from the reference power source 36 is thereby input to the cell-selection switch 32.

At the next step 204, the control circuit 22 sets the switching element switch 3 of the switch group 3 that connects the selected power-supply line V (the power supply-line V at the low potential side out of the selected power-supply lines V) to the reference voltage dividing resistor 38, to the ON state. As illustrated in FIG. 6, here, the control circuit 22 sets the switching element switch $3_{n-1}$ to the ON state. The control circuit 22 also sets the switching element switch 8 to the ON state. The control circuit 22 also sets the switching element switch 4 of the switch group 4 corresponding to the battery cell C and the switching element switch 9 to the ON state, such that the reference voltage A is voltage divided, and a voltage corresponding to the battery cell C (battery cell Cn) is supplied. As illustrated in FIG. 6, here, the control circuit 22 sets the switching element switch $4_n$ of the switch group 4 to the ON state. Note that in the control circuit 22 of the present exemplary embodiment, when self-diagnosis is performed in this manner, a voltage corresponding to each battery cell C is supplied; however, there is no limitation thereto, and alternatively, configuration may be made such that a voltage for self-diagnosis is supplied. Note that it is preferable to perform self-diagnosis using a similar state (conditions) when measuring the battery voltage of each of the battery cells C, and the diagnostic precision can be increased by supplying voltages corresponding to each of the battery cells C, as in the present exemplary embodiment.

An electrical signal corresponding to the reference voltage B obtained by the reference voltage dividing resistor 38 voltage dividing the reference voltage A supplied from the reference power source 36 is thereby input to the cell-selection switch 32.

At the next step 206, the control circuit 22 causes an electrical signal to be output that corresponds to the difference between the electrical signal corresponding to the reference voltage A and the electrical signal corresponding to the reference voltage B input from cell-selection switch 32 from the level shifter circuit 40. An analog electrical signal corresponding to the reference voltage A—the reference voltage B is thereby input to the AD converter 42.

At the next step 208, the control circuit 22 causes the analog electrical signal corresponding to the reference voltage A—the reference voltage B input from the AD converter 42 to be converted into a digital signal and then output. At the next step 210, the control circuit 22 causes the digital electrical signal corresponding to the output reference voltage A—the reference voltage B (referred to as the output value (A-B) hereafter) to be saved in the storage section 24, and then ends the present processing. Note that in the present exemplary embodiment, after the first control processing has completed, each of the switching element switches (switches 1 to switches 4) of the switch group 1 to the switch group 4, the switching element switches included in the cell-selection switch 32, and the switching element switch 7 to the switching element switch 10 are set to the OFF state.

Thus, when the first control processing of step 100 has completed, at the next step 102, the control circuit 22 performs second control processing. Second control processing is processing that controls such that an electrical signal corresponding to the reference voltage B output from the cell-selection switch 32 and the electrical signal corresponding to the voltage VSS are input to the level shifter circuit 40, and the electrical signal output from the level shifter circuit 40 through the AD converter 42 (an electrical signal according to the reference voltage B—the voltage VSS) is stored in the storage section 24.

Figure 7:
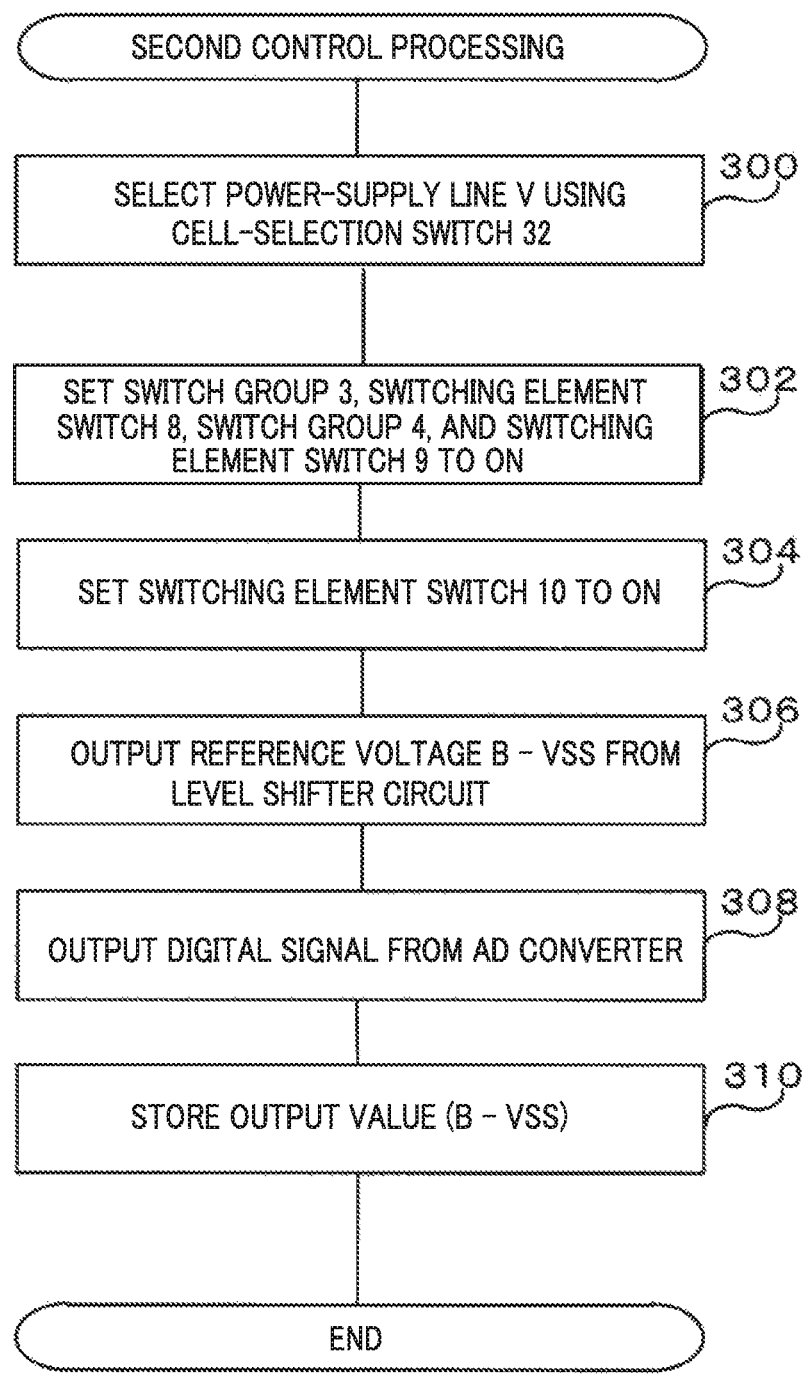
FIG. 7 is a flowchart of an example of a flow of second control processing in a self-diagnosis operation of the exemplary embodiment.

A flowchart of an example of the second control processing is illustrated in FIG. 7.

At step 300, the control circuit 22 uses the cell-selection switch 32 to select the power-supply line V corresponding to the power-supply line V (battery cell C) to be self-diagnosed. In the present exemplary embodiment, the power-supply line $V_n$ and the power-supply line $V_{n-1}$ are selected as a specific example.

Next, at step 302, the control circuit 22 sets the switching element switch 3 of the switch group 3 that connects the selected power-supply line V (the battery line V at the high potential side out of the selected power-supply lines V) to the reference voltage dividing resistor 38 to the ON state. As illustrated in FIG. 8, here, the switching element switch $3_n$ is set to the ON state. The control circuit 22 also sets the switching element switch 8 to the ON state. Moreover, the control circuit 22 sets the switching element switch 4 of the switch group 4 corresponding to the battery cell C and the switching element switch 9 to the ON state such that the reference voltage A is voltage divided, and a voltage corresponding to the battery cell C (battery cell Cn) is supplied. As illustrated in FIG. 8, here, the control circuit 22 sets the switching element switch 4$_n$ of the switch group 4 to the ON state. Note that in the present exemplary embodiment, when self-diagnosis is performed in this manner, the control circuit 22 supplies a voltage corresponding to each battery cell C; however, there is no limitation thereto, and alternatively, configuration may be made such that a voltage for self-diagnosis is supplied. Note that it is preferable to perform self-diagnosis using a similar state (conditions) when measuring the battery voltage of each battery cell C, and the diagnostic precision can be increased by supplying a voltage corresponding to each battery cell C, as in the present exemplary embodiment. An electrical signal corresponding to the reference voltage B is thereby input to the cell-selection switch 32.

At the next step 304, the control circuit 22 sets switching element switch 10 connected to the low potential side out of the two power-supply lines connecting the cell-selection switch 32 to the level shifter circuit 40 to the ON state. The voltage VSS is thereby input to the level shifter circuit 40. At the next step 306, the control circuit 22 causes an electrical signal that corresponds to the difference between the electrical signal corresponding to the reference voltage B input by the cell-selection switch 32 and the electrical signal corresponding to the voltage VSS to be output from the level shifter circuit 40. An analog electrical signal corresponding to the reference voltage B—the voltage VSS is thereby input to the AD converter 42. At the next step 308, the control circuit 22 causes the AD converter 42 to convert the analog electrical signal corresponding to the reference voltage B—the voltage VSS into a digital signal, and output the digital signal. At the next step 310, the control circuit 22 causes the output digital electrical signal corresponding to the reference voltage B—the voltage VSS (referred to as the output value (B-VSS) hereafter) to be stored in the storage section 24, and then ends the present processing. Note that in the present exemplary embodiment, after the second control processing has completed, each of the switching element switches (switches 1 to switches 4) of the switch group 1 to the switch group 4, the switching element switches included in the cell-selection switch 32, and the switching element switch 7 to the switching element switch 10 are set to the OFF state.

Thus, when the second control processing of step 102 has completed, at the next step 104, the control circuit 22 sums the output value (A-B) stored in the storage section 24 by the first control processing and the output value (B-VSS) stored in the storage section 24 by the second control processing, and determines whether or not the summed value is equal to the reference voltage A—the voltage VSS.

When an abnormality such as a breakdown has not arisen in any of the power-supply lines V (V$_n$, V$_{n-1}$), the cell-selection switch 32, or the level shifter circuit 40, the summed value of the output value (A-B) stored in the storage section 24 by the first control processing and the output value (B-VSS) stored in the storage section 24 by the second control processing is the reference voltage A—the voltage VSS. Accordingly, when it is determined that the summed value is not the reference voltage A—the voltage VSS, this indicates that an abnormality such as a breakdown has arisen in (at least one out of) each of the power-supply lines V (V$_n$, V$_{n-1}$), the cell-selection switch 32, and the level shifter circuit 40. Note that the summed value of the output value (A-B) and the output value (B-VSS) does not need to be perfectly identical to the reference voltage A—the voltage VSS for abnormalities not to be determined, namely, for normal functioning to be determined. A voltage within a range (a permissible range) in which the summed value is considered equivalent to the reference voltage A—the voltage VSS, predetermined according to the precision of the voltage measuring section 34 and the like, is sufficient.

When negative determination is made at step 104, processing proceeds to step 106 since an abnormality has arisen, and the control circuit 22, for example, suspends operation of an assembled-battery system 1000, and issues a notification indicating that an abnormality occurred, and after specific measures have been taken, processing proceeds to step 110. However, when affirmative determination is made at step 104, since normal operation is occurring (no abnormality has arisen), the control circuit 22 advances processing to step 110 after recognizing normal functioning at step 108.

At the next step 110, the control circuit 22 determines whether or not processing has completed. When self-diagnosis has not yet been performed for all of the power-supply lines V corresponding to the battery cells C, negative determination is made, processing returns to step 100, and the present processing is repeated. However, When self-diagnosis has been performed for all of the power-supply lines V corresponding to the battery cells C, affirmative determination is made, and the present processing ends.

Note that in the present exemplary embodiment, processing of step 100 to step 110 is performed for each of the respective battery cells C; however, there is no limitation thereto, and configuration may be made such that the first control of step 100 and the second control of step 102 are performed for all of the respective battery cells C, and the processing of step 104 is performed for each of the battery cells C after the output values (A-B) and the output values (B-VSS) have been saved in the storage section 24 for all of the battery cells C.

As explained above, the voltage measurement circuit 30 provided to the semiconductor circuit 14 of the present exemplary embodiment includes the cell-selection switch 32, the voltage measuring section 34, the reference power source 36, the reference voltage dividing resistor 38, the switch group 1, the switch group 2, the switch group 3, the switch group 4, the switching element switch 7, the switching element switch 8, and the switching element switch 10. Moreover, the voltage measuring section 34 includes the level shifter circuit 40 and the AD converter 42.

When self-diagnosis is performed, first, the control circuit 22 uses the first control to set the switching element switch 2 of the switch group 2 that connects the power-supply line V at the high potential side of the battery cell C to the reference power source 36, and the switching element switch 7, to the ON state, while the switching element switches 1 of the switch group 1 all remain in the OFF state, and inputs an electrical signal corresponding to the reference voltage A to the cell-selection switch 32. The control circuit 22 sets a switching element switch 4 of the switch group 4 and the switching element switch 9 to the ON state such that the reference voltage A is voltage divided to obtain the reference voltage B corresponding to the battery cell C. Moreover, the control circuit 22 sets the switching element switch 3 of the switch group 3 and the switching element switch 8, which connect the power-supply line V at the low potential side of the battery cell C to the reference voltage dividing resistor 38, to the ON state, such that an electrical signal corresponding to the reference voltage B is input to the cell-selection switch 32. An analog electrical signal corresponding to the difference between the electrical signal corresponding to the reference voltage A and the electrical signal corresponding to the reference voltage B that are output from the level shifter circuit 40 is input to the AD converter 42. An electrical signal converted into a digital signal (the output value (A-B)) is output from the AD converter 42.

Next, the control circuit 22 uses the second control to set the switching element switch 4 of the switch group 4 and the switching element switch 9 to the ON state such that the reference voltage A is voltage divided to obtain the reference voltage B corresponding to the battery cell C. Moreover, the control circuit 22 sets the switching element switch 3 of the switch group 3 and the switching element switch 8, which connect the power-supply line V at the high potential side of the battery cell C to the reference voltage dividing resistor 38, to the ON state, such that an electrical signal corresponding to the reference voltage B is input to the cell-selection switch 32. Moreover, the control circuit 22 sets the switching element switch 10 to the ON state such that the voltage VSS is input to the level shifter circuit 40. An analog electrical signal corresponding to the difference between the electrical signal corresponding to the reference voltage B and the voltage VSS output from the level shifter circuit 40 is input to the AD converter 42. An electrical signal converted into a digital signal (the output value (B-VSS)) is output from the AD converter 42.

Moreover, control circuit 22 sums the output value (A-B) obtained by the first control and the output value (B-VSS) obtained by the second control, and determines whether or not the summed value is recognized as identical to, or within a permissible range of, the reference voltage A—the voltage VSS. When the summed value is not recognized as identical or within the permissible range, the control circuit 22 makes diagnosis that an abnormality such as a breakdown has occurred in (at least one out of) each of the power-supply lines V ($V_n$, $V_{n-1}$), the cell-selection switch 32, and the level shifter circuit 40. However, when the summed value is inferred to be identical or within the permissible range, the control circuit 22 makes diagnosis that there is normal functioning (that no abnormality has arisen).

Thus, in the present exemplary embodiment, input/output conversion characteristics are self-diagnosed based on the output value (A-B) that is output from the AD converter 42 through each of the power-supply lines V ($V_n$, $V_{n-1}$), the cell-selection switch 32, and the level shifter circuit 40, and based on the output value (B-VSS) obtained while the directly input reference voltage B is output from the AD converter 42. Therefore, in the present exemplary embodiment, the precision of input/output characteristics of the circuit subject to diagnosis can be diagnosed even when the precision of the reference voltage B is not equal to or higher than the input/output conversion precision of the circuit subject to diagnosis (for example, the level shifter circuit 40). Accordingly, self-diagnosis can be performed appropriately irrespective of the precision of the reference voltage B.

Moreover, in the present exemplary embodiment, a breakdown by the cell-selection switch 32 can be detected since individual voltages (reference voltages B) differ for each of the pathways (power-supply lines V) of the cell voltage C.

Note that in the present exemplary embodiment, self-diagnosis is performed using the power-supply line V connected to the high potential side and the power-supply line V connected to the low potential side of each of the battery cells C; however, there is no limitation thereto, and any two power-supply lines V that produce a potential difference may be employed. Note that using the power-supply line V connected to the high potential side and the power-supply line V connected to the low potential side of each of the battery cells C as in the present exemplary embodiment enables ordinary measurement processing (program for measurement processing) employed in the measurement of the battery voltages of the battery cells C by the voltage measurement circuit 30 to be widely used, and this is therefore preferable.

Moreover, when the battery voltage across the plural battery cells C (the voltage between the highest potential and the lowest potential of the battery cell group 12 that is subject to measurement) is measured all at once, it is preferable to make connections such that the reference voltage A is supplied to the power-supply line V having the highest potential (the power-supply line $V_{n+1}$ in the present exemplary embodiment), and the reference voltage B is supplied to the power-supply line V having the lowest potential (the power-supply line V1 in the present exemplary embodiment).

Moreover, in the present exemplary embodiment, the reference voltage A is supplied by the reference power source 36 included in the voltage measurement circuit 30; however, there is no limitation thereto, and the reference voltage A may be supplied from outside of the voltage measurement circuit 30, and may also be supplied from outside of the semiconductor circuit 14.

Moreover, configurations of the assembled-battery system 1000, the semiconductor circuit 14, the voltage measurement circuit 30, the breakdown diagnosis operation, and the like described in the present exemplary embodiment are merely examples, and it goes without saying that modifications can be made according to the situation within a range not departing from the spirit of the present invention.

The entire disclosure of Japanese Patent Application 2013-124054 is incorporated by reference in the present specification.

All publications, patent applications and technical standards mentioned in the present specification are incorporated by reference in the present specification to the same extent as if the individual publication, patent application, or technical standard was specifically and individually indicated to be incorporated by reference.

The invention claimed is:

1. An assembled-battery system comprising:
a plurality of batteries connected together in series;
a plurality of power-supply lines respectively connected to the plurality of batteries;
a selection unit that selects two power-supply lines from the plurality of power-supply lines;
a measuring unit comprising a conversion unit that in cases in which electrical signals flowing through the two power-supply lines selected by the selection unit have been input, provides a difference between the electrical signals flowing through the two power-supply lines as an analog signal to monitor battery voltages of the plurality of batteries, converts the analog signal into a digital signal, and outputs the digital signal;
a control unit that performs predetermined operations on the digital signal output from the measuring unit, and outputs an electrical signal corresponding to a result of the predetermined operations; and
a reference voltage divider that supplies a second reference voltage, obtained by voltage dividing a first reference voltage, to the power-supply lines,
wherein self-diagnosis of the measuring unit is performed based on whether or not a summed value, summed by the control unit, of a difference between the first reference voltage and the second reference voltage output from the measuring unit, and a difference between the second reference voltage and a third reference voltage that is smaller than the second reference voltage, is a value corresponding to the first reference voltage irrespective of the second reference voltage.

2. A semiconductor circuit comprising:

a plurality of power-supply lines respectively connected to a plurality of serially connected batteries;

a selection unit that selects two power-supply lines from the plurality of power-supply lines;

a measuring unit comprising a conversion unit that in cases in which electrical signals flowing through the two power-supply lines selected by the selection unit have been input, provides a difference between the electrical signals flowing through the two power-supply lines as an analog signal to monitor battery voltages of the plurality of batteries, converts the analog signal into a digital signal, and outputs the digital signal; and a reference voltage divider that supplies a second reference voltage, obtained by voltage dividing a first reference voltage, to the power-supply lines, wherein self-diagnosis of the measuring unit is performed based on whether or not a summed value of a difference between the first reference voltage and the second reference voltage output from the measuring unit, and a difference between the second reference voltage and a third reference voltage that is smaller than the second reference voltage, is a value corresponding to the first reference voltage irrespective of the second reference voltage.

3. The assembled-battery system of claim 1, wherein both of the differences are measured based on the first and second reference voltages generated based on an identical reference power source.

4. The assembled-battery system of claim 3, further comprising the reference power source that generates and supplies the first reference voltage.

5. The semiconductor circuit of claim 2, wherein both of the differences are measured based on the first and second reference voltages generated based on an identical reference power source.

6. The semiconductor circuit of claim 5, further comprising the reference power source that generates and supplies the first reference voltage.

* * * * *